United States Patent [19]
Bayer et al.

[11] Patent Number: 5,817,581
[45] Date of Patent: Oct. 6, 1998

[54] PROCESS FOR THE CREATION OF A THERMAL SIO₂ LAYER WITH EXTREMELY UNIFORM LAYER THICKNESS

[75] Inventors: Thomas Bayer, Aidlingen; Johann Greschner, Pliezhausen; Klaus Meissner, Herrenberg-Kayh, all of Germany

[73] Assignee: International Business Machines Corporation, Armonk, N.Y.

[21] Appl. No.: 702,608

[22] PCT Filed: Apr. 21, 1995

[86] PCT No.: PCT/EP95/01518

§ 371 Date: Aug. 26, 1996

§ 102(e) Date: Aug. 26, 1996

[87] PCT Pub. No.: WO96/33510

PCT Pub. Date: Oct. 24, 1996

[51] Int. Cl.⁶ ................................................. H01L 21/316
[52] U.S. Cl. ........................................ 438/770; 438/773
[58] Field of Search .......................... 437/239; 438/770, 438/773; 427/255.4; 148/118

[56] References Cited

U.S. PATENT DOCUMENTS

| | | | |
|---|---|---|---|
| 3,899,372 | 8/1975 | Esch et al. ................................. | 148/187 |
| 4,139,658 | 2/1979 | Cohen et al. .............................. | 438/773 |
| 4,214,919 | 7/1980 | Young ....................................... | 438/773 |
| 4,268,538 | 5/1981 | Toole et al. ............................... | 438/773 |
| 4,376,796 | 3/1983 | Arrasmith et al. ....................... | 437/239 |
| 4,518,630 | 5/1985 | Grasser .................................. | 427/255.4 |
| 4,906,595 | 3/1990 | van der Plas et al. ................... | 437/239 |
| 5,009,926 | 4/1991 | Fukuda .................................. | 427/255.4 |
| 5,057,463 | 10/1991 | Bryant et al. ............................ | 438/773 |
| 5,123,994 | 6/1992 | Paulsen et al. .......................... | 156/603 |
| 5,210,056 | 5/1993 | Pong et al. ............................... | 437/239 |
| 5,244,843 | 9/1993 | Chau et al. ............................... | 437/239 |
| 5,296,411 | 3/1994 | Gardner et al. .......................... | 437/238 |
| 5,316,981 | 5/1994 | Gardner et al. .......................... | 438/773 |
| 5,633,212 | 5/1997 | Yuuki ....................................... | 438/773 |

FOREIGN PATENT DOCUMENTS

| | | |
|---|---|---|
| 2092730 | of 0000 | France . |
| 53-062983 | 8/1978 | Japan . |
| 61-220338 | 9/1986 | Japan ..................................... 437/239 |

OTHER PUBLICATIONS

IBM Technical Disclosure Bulletin, A. Berman, Entitled: Process for Forming SiO₂, vol. 15, No. 11, Apr. 1973, New York US p. 3535.

IBM Technical Disclosure Bulletin, R. Silverman et al., Entitled: Low Temperature Oxidation Method for Self–Passivation of Polysilicon Conductors During Gate Oxide Growth, vol. 22, No. 3, Aug. 1979 New York, US, p. 935.

Journal of the Electrochemical Society, M.B. Das, Entitled: A Comparison of HCl– and Trichloroethylene Grown Oxides onsilicon, vol. 131, No. 2, Feb. 1984 Manchester, New Hampshire US, pp. 389–392 Feb. 1984 Manchester, New Hampshire US, pp. 389–392 M.B. Das, A Comparison of HCl– and Trichloroethylene–Grown Oxides on Silicon, Feb. 1994.

Worf, Stanley *Silicon Processing for the VLSI Era*, vol. 1, p. 198 (1986).

Primary Examiner—Charles L. Bowers, Jr.
Assistant Examiner—Matthew Whipple
Attorney, Agent, or Firm—Steven J. Soucar

[57] ABSTRACT

Disclosed is a reproducible process for making an SiO₂ layer by thermal oxidation which assures an extremely uniform thickness of the SiO₂ layer of approximately 1%. The process of the invention comprises the steps growing an initial layer of SiO₂ to a defined minimal thickness by dry oxidation and increasing the thickness of the initial layer by simultaneous wet and dry oxidation until the desired final thickness is reached.

3 Claims, 1 Drawing Sheet

PROCESS FOR THE CREATION OF A THERMAL SIO₂ LAYER WITH EXTREMELY UNIFORM LAYER THICKNESS

The invention relates to a process for making an $SiO_2$ layer by thermal oxidation and in particular to a reproducible process which assures an extremely uniform thickness of the $SiO_2$ layer.

Thermally oxidizing silicon surfaces is one of the key process steps for manufacturing micromechanical as well as semiconductor devices. In the semiconductor manufacturing process sequence the critical oxidation step is producing the gate oxide layer for field effect transistors. These extremely thin oxide layers, a typical thickness range is 10 nm to 20 nm, have to fulfill high quality requirements and therefore the thermal oxidation for these layers is done with dry oxygen which provides the known small oxidation rate. Using dry oxidation thickness uniformities of these thin layers which are in the range of about 1% to 4% may be achieved.

For thin oxide layers the slow dry oxidation may be tolerable, but not for oxide layers in the range from 0.1 μm up to several μm which are usual for the silicon-on-insulator technology and for various types of micromechanical devices like e.g. calibration standards as disclosed in the application EP 94 10 5568 filed Apr. 11, 1994.

Especially for the calibration standard the uniformity of the silicon oxide layer should be as best as possible since it directly affects the accurateness of the standard.

Variations in either the temperature or wetness of the various wafers which are being processed, caused by variations in the cleaning procedure and/or the air to which the wafers are exposed, cause variations in the rate of initial heating and oxidation of the wafers and thereby cause significant large variations in the amount of oxide growth, especially in the spontaneous oxide layer. To eliminate these effects in U.S. Pat. No. 3,892,891 the wafers are pre-heated at a moderate temperature, e.g. in the range between 100° and 200° C., in a controlled atmosphere, e.g. air having a controlled dew point.

Todays' furnace manufacturer guarantee uniformities of 1% for dry oxygen and 2.5% for wet oxygen processes. Assuming a desired layer thickness of 1 μm this would mean uniformity differences of about 10 nm to 30 nm which is not sufficient for e.g. micromechanical calibration standards.

It is an object of the present invention to provide a reproducible process for the creation of a thermal $SiO_2$ layer which shows an extreme uniformity in the layer thickness of approximately 1%.

The process of the invention comprises the steps growing an initial layer of $SiO_2$ to a defined minimal thickness by dry oxidation and increasing the thickness of the initial layer by simultaneous wet and dry oxidation until the desired final thickness is reached.

Figure 1:
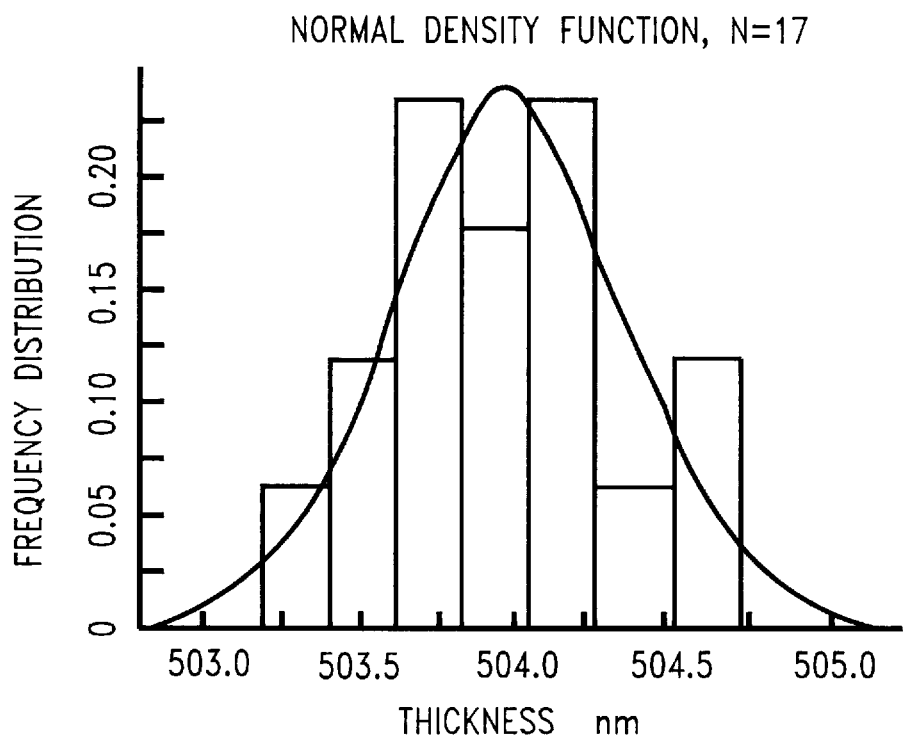
FIG. 1 illustrates an example for the thickness variation of a silicon oxide layer.

This process offers the possibility to reproducibly manufacture relatively thick oxide layers with uniformities better than oxide layers of the same thickness made with dry oxygen only. The uniformity of oxide layers produced according to the claimed process and having a thickness of 0.5 μm was ±0.37 nm along a 50 mm diameter line in the center of a 100 mm wafer. An example for the thickness variation of a 0.5 μm silicon oxide layer is given in FIG. 1.

Further preferable solutions and embodiments are apparent from the dependent claims.

One way of carrying out the invention is described in detail below with reference to FIG. 2 which shows the temperature/time profile of a special process sequence.

Figure 2:
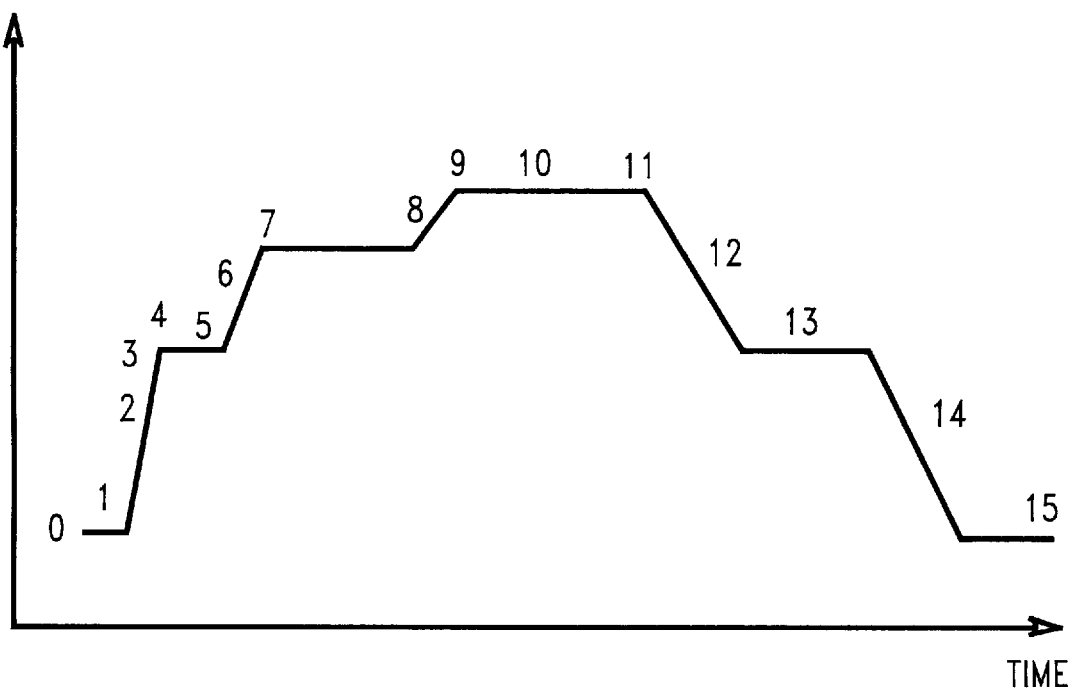
FIG. 2 illustrates a temperature/time profile of a preferred process sequence.

In FIG. 2 there is shown the temperature/time profile of a preferred process sequence of the invention with the various phases 0 to 15.

Phase 0 represents the loading of the oxidation chamber, which typically is a quartz tube, with semiconductor wafers or other substrate material which is to be coated with silicon dioxide. This loading step takes place at uncritical low temperatures of about 600° C. and is followed by filling the oxidation chamber with inert media, preferably nitrogen, at this temperature during about 15 minutes with a flow rate of about 10 l/min. Step 1 helps stabilizing the temperature in the oxidation chamber and assures the chamber being completely filled with nitrogen which prevents the oxidation process starting at this temperature.

In steps 2 and 3 the temperature in the oxidation chamber is increased until a defined first low oxidation temperature is reached. The first quick ramping step with a temperature increase of about 7° C./min and a flow rate of 2 l/min nitrogen stops shortly before reaching the first low oxidation temperature and with the second slow ramping step with about 1° C./min the desired first low oxidation temperature finally is reached. Typically the first low oxidation temperature is in the range between approximately 600° C. and approximately 850° C.

A nitrogen flow of 2 l/min at this first low oxidation temperature in step 4, during about 10 min, stabilizes the temperature in the oxidation chamber for the next important step 5 in which the dry oxidation of an initial layer starts. The nitrogen is quickly removed from the oxidation chamber by a defined flow of dry oxygen of about 10 l/min. This high flow rate assures the quick exchange of nitrogen and oxygen in the oxidation chamber at the first low oxidation temperature. Step 5 assures a controlled and slow start of the dry oxidation step for an initial layer at the desired first oxidation temperature.

After the quick exchange of inert and oxidizing media in the oxidation chamber in step 6 oxygen with a defined low flow rate enters the oxydation chamber. Preferably the flow rate is as low as 0.5 l/min. The exchange of nitrogen and oxygen being completed, during step 6 the temperature in the oxidation chamber is again slowly increased from the first low oxidation temperature to a defined second oxidation temperature with about 1° C./min. The second oxidation temperature is higher than the first low oxidation temperature and is in the range between approximately 950° C. and approximately 1050° C.

These two steps, step 5 and step 6, at the beginning of the dry oxidation process, have great impact on the thickness uniformity of the silicon dioxide layer to be formed. They assure the controlled, homogeneous and slow start of the dry oxidation step at the relatively low first oxidation temperature. Of similar importance is the quick exchange of nitrogen and oxygen and the low flow rate of oxygen after the exchange being completed. Together with the low first oxidation temperature this keeps low the growth rate of the thermal dry oxide layer and provides a high quality oxide layer.

In step 7 the second oxidation temperature is kept constant for about 4 hours during which dry oxidation occurs until a defined minimal thickness of the initial layer is reached. The defined minimal thickness of the initial layer of $SiO_2$ is independent from the desired final thickness. It is in the range between approximately 100 nm and approximately 200 nm.

During the following steps the thickness of the initial layer will be increased by simultaneous wet and dry oxidation until the desired final thickness is reached.

In step 8 the temperature in the oxidation chamber is slowly increased by about 1° C./min with about 0.5 l/min oxygen until a defined third oxidation temperature is reached. The third oxidation temperature is higher than the first oxidation temperature and is in the range between approximately 950° C. and approximately 1050° C.

For reasons of temperature stabilization the third oxidation temperature is kept constant during about 10 min in step 9 with 0.5 l/min oxygen flow before the simultaneous wet and dry oxidation starts in step 10 at the third oxidation temperature.

By separate inlet means a defined flow of water vapour and a defined flow of oxygen, preferably 0.5 l/min, are simultaneously provided into the oxidation chamber during a predetermined second time period, preferably of about 1 hour 25 min. During this time period the third oxidation temperature is kept constant.

Another alternative possibility to reach the desired final thickness is to start with step 10 directly after step 7, that is running the simultaneous wet and dry oxidation at the second oxidation temperature during the predetermined second time period.

In step 11 the simultaneous wet and dry oxidation process is stopped by providing only oxygen into the oxidation chamber and keeping constant the second or third oxidation temperature for further approximately 10 min.

Thereafter the controlled downramping in several steps begins. These steps also have some impact on the thickness uniformity since during at least some of the downramping steps further oxide growth is to be expected.

With about 1° C./min in step 12 the second or third oxidation temperature slowly decreases until approximately the first low oxidation temperature is reached and during this step of decreasing the oxidation temperature a defined flow of dry oxygen of about 0.5 l/min is provided into the oxidation chamber.

In step 13 the oxidation process is stopped in a controlled manner. The low oxidation temperature is kept constant during about 10 min to allow the quick exchange of oxygen and nitrogen with a nitrogen flow rate of approximately 10 l/min.

The second downramping step 14 further decreases the temperature with 3° C./min and a nitrogen flow rate of about 2 l/min until a temperature suitable for deloading the oxidation chamber is reached.

In the example described above the desired final thickness of the silicon dioxide layer produced was 500 nm. This thickness was reached during the dry, wet/dry and dry oxidation steps 5 to 13. The thickness uniformity of the 0.5 μm silicon dioxide layer produced according to the process described above is shown in FIG. 1. Along a 50 mm diameter line in the center of a 100 mm wafer there were only thickness variations as small as ±0.37 nm to be found.

What is claims is:

1. A process for the creation of a thermal $SiO_2$ layer with extremely uniform layer thickness, the process comprising the steps of:

growing an initial layer of $SiO_2$ to an initial thickness by dry oxidation; and increasing the thickness of said initial layer by subsequent oxidation until the desired final thickness is reached, wherein said step of growing an initial layer of $SiO_2$ further comprises the steps of:

providing a inert media into an oxidation chamber;

increasing the temperature in said oxidation chamber until a first low oxidation temperature is reached;

starting said dry oxidation at said low oxidation temperature by removing said inert media from said oxidation chamber and providing dry oxygen into the oxidation chamber;

increasing the temperature in said oxidation chamber from a first low oxidation temperature to a second oxidation temperature, said second oxidation temperature being higher than said first low oxidation temperature; and keeping constant said second oxidation temperature in said oxidation chamber for a first time period, and wherein said increasing the thickness of said initial layer further comprises the steps of:

increasing the temperature in said oxidation chamber until a third oxidation temperature is reached, said third oxidation temperature being higher than said first oxidation temperature;

starting said subsequent oxidation at said third oxidation temperature; and keeping constant said third oxidation temperature in said oxidation chamber for a second time period.

2. The process of claim 1 wherein after increasing the thickness of said initial layer the process further comprises the steps of decreasing said third oxidation temperature until said first low oxidation temperature is reached and during said step of decreasing said oxidation temperature providing dry oxygen into the oxidation chamber.

3. The process of claim 1 wherein said first low oxidation temperature is in the range of approximately 600° C. to approximately 850° C., said second oxidation temperature is in the range of approximately 950° C. to approximately 1050° C. and said third oxidation temperature is in the range of approximately 950° C. to approximately 1050° C.

* * * * *